United States Patent [19]

Blumenstock et al.

[11] Patent Number: 4,994,349
[45] Date of Patent: Feb. 19, 1991

[54] PRINTED WIRING BOARD FABRICATION METHOD

[75] Inventors: Brent J. Blumenstock, Trenton, N.J.; Jose A. Ors, New Hope, Pa.

[73] Assignee: AT&T Bell Laboratories, Murray Hill, N.J.

[21] Appl. No.: 211,808

[22] Filed: Jun. 27, 1988

[51] Int. Cl.⁵ .............................................. G03F 7/00
[52] U.S. Cl. .................................... 430/314; 430/318; 430/319; 430/329; 204/15
[58] Field of Search ............... 430/314, 315, 319, 329, 430/318; 204/15

[56] References Cited

U.S. PATENT DOCUMENTS

| | | | |
|---|---|---|---|
| 3,390,061 | 6/1968 | Levinos | 204/15 |
| 3,980,483 | 9/1976 | Nishikubo et al. | 96/115 |
| 4,606,788 | 8/1986 | Moran | 156/656 |
| 4,707,394 | 11/1987 | Chant | 428/209 |
| 4,746,399 | 5/1988 | Demmer et al. | 156/656 |
| 4,751,172 | 6/1988 | Rodriquez et al. | 430/314 |
| 4,861,438 | 8/1989 | Banks et al. | 204/15 |

OTHER PUBLICATIONS

Draper, Printed Circuits and Electronics Assemblies, Robert Draper Ltd., Teddingten, Great Britian, Oct. 1969.
Fefferman, "A UV-Curable Solder Mask . . . ", Proc. Electr/Electron Insul. Conf., 1977, vol. 13, pp. 97–101.
Printed Circuits Handbook, Clyde F. Coombs, Jr., McGraw-Hill Book Company, 1979, New York, pp. 7-33 thru 7-35 (Second Edition).

Primary Examiner—Jose G. Dees
Attorney, Agent, or Firm—R. B. Anderson

[57] ABSTRACT

The specification describes a process for making a plating mask (17), for use in printed wiring board fabrication, with greater precision and definition than has previously been possible. An insulative substrate (11) includes on one surface a thin metal film (13). The film is covered with a relatively thick first mask layer (16) which is selectively removed to expose portions of the metal film, which are in turn removed to expose portions of the insulative substrate (11). The exposed portions of the insulative substrate are covered with a relatively thick plating mask layer (17) which abuts against the first mask layer (16). The first mask layer is then removed, leaving the remaining plating mask layer as a patterned plating mask which is then used as a mask for deposited metal (19) which defines a printed circuit.

11 Claims, 4 Drawing Sheets 4,994,349

PRINTED WIRING BOARD FABRICATION METHOD

TECHNICAL FIELD OF THE INVENTION

This invention relates to the manufacture of printed wiring boards, and more particularly, to printed wiring boards having a high conductor density and high requirements for conductor definition.

BACKGROUND OF THE INVENTION

Printed circuit boards or printed wiring boards (PWB) comprise an insulative substrate upon which a metal pattern defining an electronic circuit has been formed. Electronic devices are typically mounted on the PWB to form an electronic system or subsystem. As described, for example, in the book Printed Circuits Handbook, F. Coombs, Jr., McGraw Hill (1979), the metal pattern defining the circuit may be made by procedures known as the subtractive, the additive, or the semi-additive process.

With the subtractive process, a metal layer is bonded to the surface of the insulative substrate by a procedure such as the hot press lamination process. A photoresist is then coated over the metal layer and exposed through a patterned mask to actinic radiation. After development of the photoresist, the metal layer is selectively etched to leave a metal pattern defining the conductive pattern desired.

With the additive process, a patterned plating mask is used to mask certain regions of the insulative substrate as metal is being plated on exposed portions of the substrate. After proper preparation of the surface of the substrate (as by catalyzation), the metal can be plated directly on it by electroless deposition. This requires submergence of the substrate in an appropriate plating bath, and of course the plating mask must be sufficiently robust to withstand exposure to the plating bath. If, after electroless plating of a portion of the desired metal pattern, electroplating is used for depositing the remaining portion, the process is known as the semi-additive process.

As electronic systems become more complex and more miniaturized, there is a continuing demand for higher circuit density, and for more closely packed and more precisely defined conductors. Part of this demand can be met by using multilayer PWBs in which a plurality of substrates, each having a metal pattern defining part of the electronic circuit, are laminated together. Conductive interconnection between the PWB layers is made by holes through adjoining layers known as conductive vias. Nevertheless, there has been a continuing demand for conductors that are sufficiently thick to conduct the current required, and yet are made with such high precision and definition as to permit closer conductor spacing.

With the subtractive process, it has been found to be difficult to obtain the required high precision because of undercutting of the metal layers by the etch. With the additive or semi-additive process, it has been found to be difficult to form plating masks that are sufficiently thick to match the thickness of the plated metal, sufficiently robust to withstand exposure to a plating bath, and which still can be patterned with the requisite precision.

SUMMARY OF THE INVENTION

In accordance with one embodiment of the invention, the foregoing problems are solved in a process that uses a thin metal film over an insulative substrate. The film is covered with a relatively thick first mask layer which is selectively removed to expose portions of the metal film, which are in turn removed to expose portions of the insulative substrate. The exposed portions of the insulative substrate are covered with a relatively thick plating mask layer which abuts against the first mask layer. Then the first mask layer is removed, leaving the remaining plating mask layer which defines the plating mask in an additive plating process.

While the plating mask is relatively thick and sufficiently robust to withstand exposure to a plating bath, the definition with which the pattern is defined is limited only by the definition with which the pattern can be defined in the thin metal film. As is known, the subtractive process can define conductive patterns in thin metal films with very high precision. It will be seen that this high precision is in turn translated to the precision with which the plating mask pattern is defined. Another advantage of the invention is that the portion of the insulative substrate to be plated is already covered with the metal film, which makes plating, either by electroplating or electroless plating, easier.

These and other objects, features, and advantages of the invention will be better understood from a consideration of the following detailed description taken in conjunction with the accompanying drawing.

DRAWING DESCRIPTION

FIGS. 1 through 5 schematically illustrate successive steps in a printed wiring board fabrication process in accordance with an illustrative embodiment of the invention;

FIG. 6 is a schematic view showing one step in the formation of a conductive via in accordance with one embodiment of the invention;

FIGS. 7 through 13 schematically illustrate successive steps in a process for making printed wiring boards in accordance with another embodiment of the invention;

FIGs. 14 through 19 schematically illustrate successive steps in forming a plated through-hole in accordance with an illustrative embodiment of the invention.

DETAILED DESCRIPTION

Figure 1:
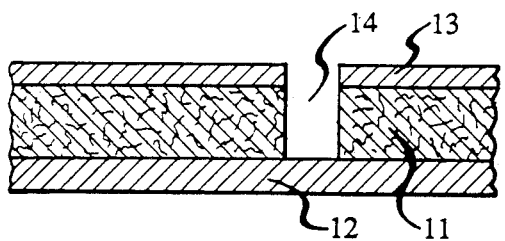

Referring now to FIGS. 1 through 5, there is illustrated schematically successive steps in the forming of a conductive pattern on an upper surface of a multilayer printed wiring board in accordance with an illustrative embodiment of the invention. The starting material for one layer of the multilayer PWB is an insulative substrate 11 clad on opposite sides with metal film layers 12 and 13. The metal film 13 is quite thin, typically 0.17 mil, which it i to be understood, is of insufficient thickness to conduct the current densities required. It is assumed, however, that metal layer 12 is of sufficient thickness that a circuit defined therein may be made by a conventional process such as the subtractive technique. A small hole 14, typically 4–20 mils in diameter, is initially drilled in the substrate 11 to the film layer 12, which will eventually constitute an interconnection known in the art as a conductive via for conductively interconnecting film layers 12 and 13. The sides of the hole 14 are preferably catalyzed, a known technique for preparing it for later plating. The film layer 13 is preferably of copper and, with the thickness described, is known in the art as one-eighth ounce copper.

Figure 2:
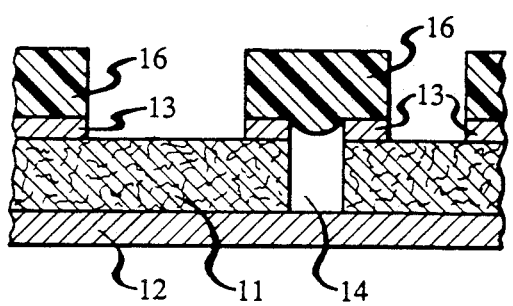

The upper surface of metal film 13 is next covered with a relatively thick layer of photoresist 16. The photoresist is typically a 0.5 to 2 mil thick dry film resist, preferably aqueous based. It is contemplated that the photoresist would normally have a thickness in excess of about 1 mil, which is important for reasons that will be appreciated later. The photoresist is selectively exposed to actinic radiation through a mask describing the desired conductive pattern. Developing selectively removes portions of the photoresist to expose areas of the metal film 13. The upper surface is then exposed to a metal etch for removing the exposed areas of the metal film 13 to yield the structure shown in FIG. 2. FIG. 2 shows the thick photoresist 16 after development, which removes portions of it to define the desired pattern. The photoresist may typically be a commercially available substance known as Laminar H G ™, available from Morton Thiokol, Dynachem Division, Tustin, Calif., having a thickness of 0.5 –2 mil, which can be developed with great precision despite its thickness. The selective etching of metal film 13 can likewise be done with great precision because the metal film is so thin; because of its thinness, there is virtually no undercutting during its removal. The thick photoresist has typically sufficient viscosity to bridge the small via 14 as shown. This type of bridging is referred to in the art as "tenting," and the photoresist is said to "tent" the small interconnect passage 14.

Figure 3:
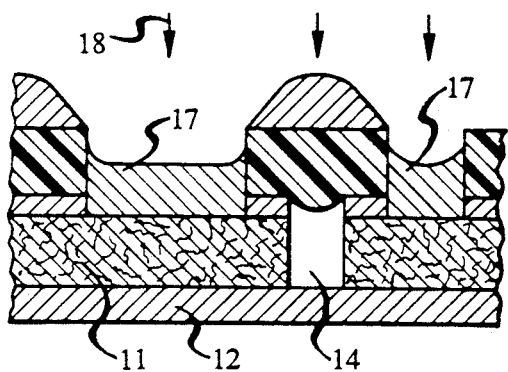

Next, the structure of FIG. 2 is coated with a material that is suitable for use as a plating mask. Coating with this material creates a plating mask layer 17 as shown in FIG. 3. Plating mask layer 17 is preferably an initially liquid photoresist of the type described in co-pending application Ser. No. 052,326 (Ors-Wright 5—5), filed May 21, 1987, and assigned to the assignee company of this application. This material is a photosensitive polymeric material based on epoxy acrylates that have been reacted in a suitable proportion with cyclic anhydrides and is referred to herein as "PDD ". The material is cured and solidified on the surface as shown in FIG. 3 by flooding it with actinic radiation, as is schematically illustrated by the arrow 18. The thickness of the layer 17 is approximately equal to that of the metal plated layer desired, for example, 0.5-2.0 mils. (As will be expained with reference to FIG. 6, the nominal thickness of the plating mask layer 17 may actually be slightly less than the plated metal thickness.) After exposure, the first photoresist layer 16 is stripped by exposing it to a sodium-hydroxide based solution as is known in the art. This in turns lifts off any of the plating mask material 17 adhering to the upper surface of the photoresist layer, thereby to leave the structure shown in FIG. 4.

Figure 4:
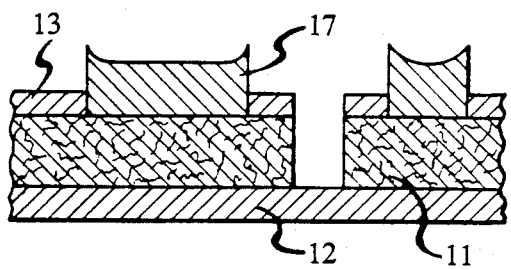

FIG. 4 Illustrates the patterned plating mask 17, which is the object of this embodiment of the invention. Although plating mask 17 is of a material sufficiently robust for plating purposes, and although it is quite thick, its boundaries have been formed with a great deal of precision because limitations on precision are only of photoresist film 16 and the ability to etch with precision metal film 13. The photoresist 16, which may typically be Laminar H G ™, is selected to give precision, definition and tenting. In the photoresist art, it is said that layer 16 is capable of defining a very small linewidth, although it is not necessary that photoresist 16 be made of a material that can withstand the rigors of a metal plating bath because such is not required. Thus, while mask 17, illustratively made of PDD, is sufficiently robust to withstand a plating bath, it is formed with significantly more definition than has previously been possible for such composition having such thickness. Another advantage of using PDD is that it is a stable dielectric material that can be permanently left in the finished structure to constitute a dielectric for the finished printed circuit.

Figure 5:
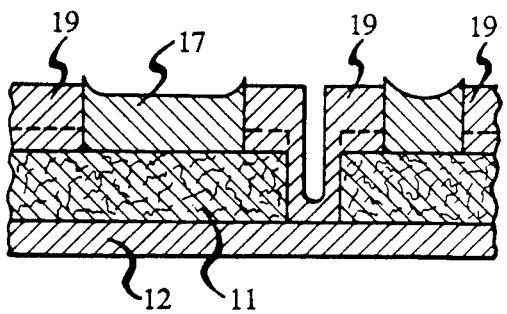

The structure of FIG. 4 is then immersed in a plating bath so that the upper surface is plated with a deposited metal plate 19 to a thickness of, for example, 0.5 to 1.5 mils to yield the structure of FIG. 5. The metal plate 19 is preferably deposited by electroless copper plating, a known procedure. Part of the plating 19 may be made by electroplating in accordance with the known semi-additive process described above. However, electroless plating normally gives more uniform coverage, especially for fine lines and small conductive vias. Since the structure of FIG. 4 is normally part of a multilayer board, metal layer 12 (apart from the via) is normally masked from the plating solution by the remaining structure of the board. Normally, the board will include another outside surface metal layer opposite that shown what will be plated simultaneously and in the same manner.

Figure 6:
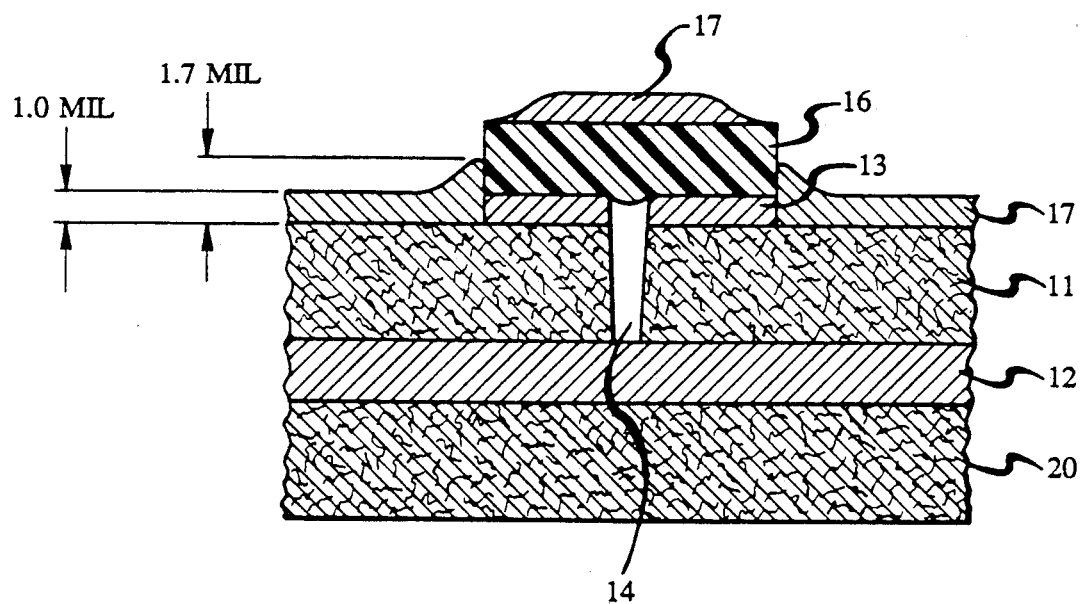
Figure 7:
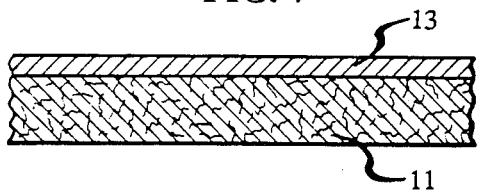
Figure 8:
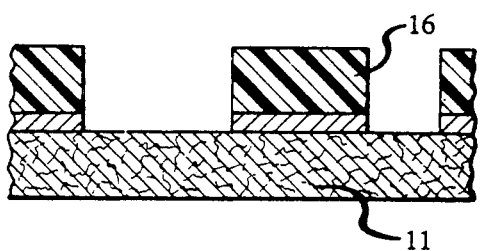
Figure 9:
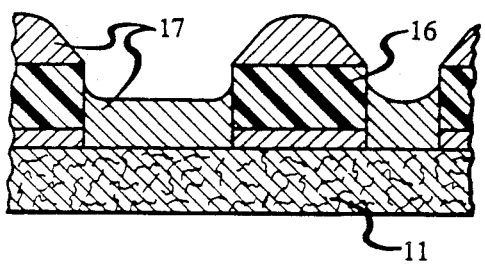
Figure 10:
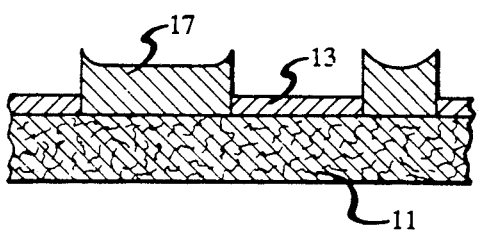

FIG. 6 is an expanded version of part of FIG. 3 (after light exposure) which is included to show relative dimensions in one experimental version that has been used. The photoresist 16 that was used was 1.8 mils thick. The plating mask was PDD having a final nominal thickness of 1.0 mil. However, because of the meniscus, the side walls were 1.7 mils thick; as a consequence, the plating mask 17 could be used as a mask for metal plating that was slightly more than 1.7 mils thick. In any event, the plating mask should bve thick enough to support a metal plating thickness in excess of 1 mil, which is normally required for responable current densities. FIG. 6 also illustsrates the tenting of the via hole by mask 16 and also illustrates that in a multilayer board, it is intended that substrate 11 be laminated to another insulative substrate 20. The thickness of copper film layer 13, 0.17 mil, is not shown in proper proportion.

Figure 11:
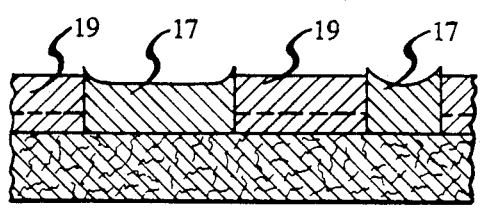
Figure 12:
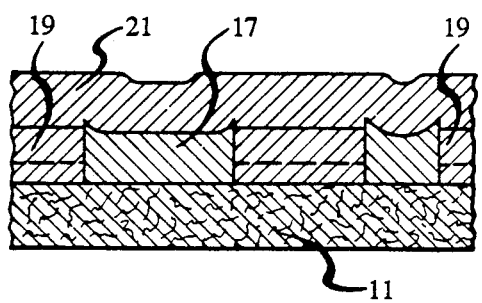
Figure 13:
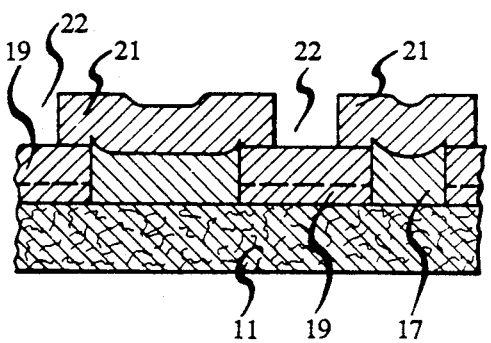

FIGS. 7–13 illustrate the use of the invention in making a PWB of the type known as a double-sided rigid (DSR) board. FIGS. 7–11 show the various steps for making the plating mask 17 and the plating layer 19 as being substantially identical with corresponding steps in FIG. 1; the reference numbers of FIGS. 7–11 therefore correspond to corresponding reference numbers of FIGS. 1–5. An additional advantage of the inventive process is that the upper surface of the structure of FIG. 11 is essentially planar; and as a result, it can easily be coated with another layer 21 of PDD material as shown in FIG. 12. As was mentioned before, the PDD plating mask 17 may be left as a permanent part of the circuit structure since it acts as a good dielectric and displays appropriately durable structural properties. Consequently, the upper surface of the structure of FIG. 11 can be covered with a dielectric layer 21 that may be used as a solder mask, and coverage will be dependable because of the relative absence of protrusions from the upper surface of the FIG. 11 structure. As shown in FIG. 13, openings 22 may be made, as by photolithographic masking and etching, in the dielectric layer 21 so as to expose portions of metal plating 19 and to permit solder contacts to be made to the printed circuits defined by metal layers 19. For this purpose, layer 21 is used in a known manner as a solder mask. Dielectric layer 21 may be of PDD which is exposed with actinic radiation to stabilize it as described before. Unexposed portions of it may be removed during development to expose the contact areas as is desired.

Figure 14:
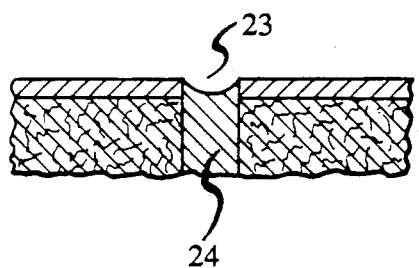
Figure 17:
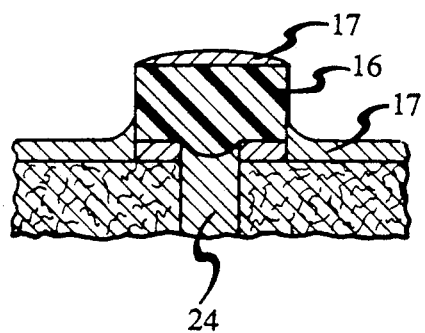
Figure 15:
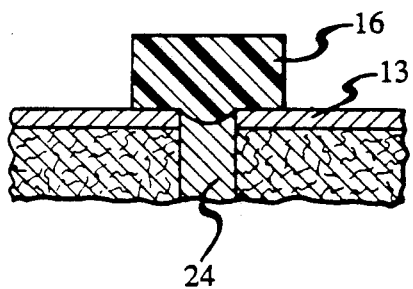
Figure 18:
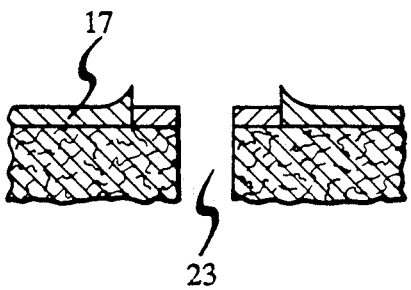
Figure 16:
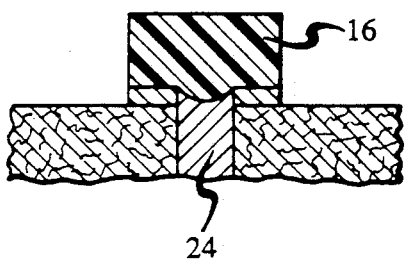
Figure 19:
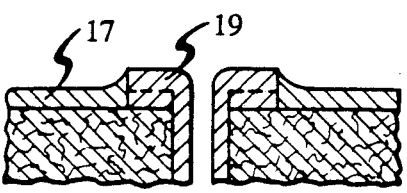

Referring to FIG. 14, conductive through-holes 23 made in double-sided rigid boards are typically much larger than the conductive vias made in the multilayer boards of the type shown in FIGS. 1 and 2. As a consequence, tenting of the hole may be undependable and, as shown in FIG. 14, a temporary filler 24 may be used to block the through-hole during the formation of the plating mask. Prior to applying the filler, hole 23 is catalyzed, as in known, to permit metal deposit by electroless deposition. Filler 24 comprises any appropriate material that will temporarily support the dry resist film and may easily thereafter be removed from the through-hole. The formation of the plating mask proceeds in FIGS. 15 though 17 as described with respect to FIGS. 1-5. Referring to FIG. 18, after the photoresist 16 has been removed, the filler 24 is likewise removed to again expose the catalyzed through-hole 23. Thereafter, the side walls of the through-hole 23 are plated by a plating metal 19 in the same manner as was described before.

The various embodiments of the invention shown and described are intended to be merely illustrative of the invention. For example, while in FIG. 5 the invention was used only to form conductive pattern 19, it could also be used to pattern the lower conductor 12. Also, the lower conductor 12 could be included on a different insulative substrate which is subsequently laminated to substrate 11, in accordance with known multilalyer PWB techniques. Other embodiments and modifications of the invention may be made by those skilled in the art without departing from the spirit and scope of the invention.

We claim:

1. A circuit forming process comprising the steps of covering a substrate with a plating mask; selectively removing parts of the plating mask; exposing the substrate to a plating bath; and selectively plating a metal over those portions of the substrate from which the plating mask has been removed, CHARACTERIZED IN THAT:

the substrate comprises an insulative substrate having a surface covered with a thin metal film; the metal film is covered with a first mask layer which is selectively removed to expose portions of the metal film; the exposed portions of the metal film are removed to expose portions of the insulative substrate; the exposed portions of the insulative substrate are covered with a plating mask layer which abuts against the first mask layer; and the first mask layer is removed, whereby the remaining plating mask layer defines the plating mask.

2. The process of claim 1 FURTHER CHARACTERIZED IN THAT:

the first mask layer is a photosensitive layer, and selective removal of the first mask layer comprises the steps of selectively exposing it to actinic radiation and developing it.

3. The process of claim 2 FURTHER CHARACTERIZED IN THAT:

the first mask layer has a thickness that is much greater than the thickness of the metal film and of the same order as the thickness of the plated metal layer.

4. The process of claim 3 FURTHER CHARACTERIZED IN THAT:

the first mask layer has a thickness in excess of 1 mil.

5. The process of claim 4 FURTHER CHARACTERIZED IN THAT:

the first mask layer, the plating mask, and the plated metal layer each has a thickness in excess of 1 mil.

6. The process of claim 5 FURTHER CHARACTERIZED IN THAT:

the plated metal layer and plating mask together form a substantially continuous upper surface; the upper surface is coated with a solder mask; portions of the solder mask are removed to expose protions of the plated metal layer; and solder contacts are made to the exposed plated metal layer portions.

7. The process of claim 6 FURTHER CHARACTERIZED IN THAT:

the plating mask is made of a stable dielectric material that permanently insulates adjacent conductors in the finished printed wiring board.

8. The process of claim 7 FURTHER CHARACTERIZED IN THAT:

the plating mask is a photosensitive polymer material based on an epoxy acrylate that has been reacted with cyclic anhydrides.

9. A circuit forming process comprising the steps of: covering a substrate with a metal film; covering the metal film with a photosensitive mask layer; selectively exposing the photosensitive mask layer to actinic radiation selectively removing the photosensitive mask layer in accordance with the exposure to the actinic radiation; removing exposed portions of the metal film by selective etching, whereby the remaining metal film is coextensive with the remaining photosensitive mask layer; covering the substrate and the photosensitive mask layer with a plating mask layer such that portions of the plating mask layer abut against portions of the photosensitive mask layer; removing the photosensitive mask layer, thereby to remove part of the plating mask layer; and using the remaining plating mask layer as a plating mask to limit plating of a plated metal layer to cover only those portions of the substrate covered by the metal film.

10. The process of claim 9 wherein: the plated metal layer is plated upon the remaining metal film.

11. The process of claim 10 wherein: the plating mask is a photosensitive polymer based on an epoxy acrylate that has been reacted with cyclic anhydrides.

* * * * *